United States Patent [19]

Wolf

[11] Patent Number: 4,781,804

[45] Date of Patent: Nov. 1, 1988

[54] ELECTROLYTIC ORGANIC MOLD FLASH REMOVAL

[75] Inventor: George C. Wolf, Kokomo, Ind.

[73] Assignee: Delco Electronics Corporation, Kokomo, Ind.

[21] Appl. No.: 163,006

[22] Filed: Mar. 2, 1988

[51] Int. Cl.⁴ .................................................. C25F 1/00
[52] U.S. Cl. .................................................. 204/141.5
[58] Field of Search ............................... 204/141.5, 146

[56] References Cited

U.S. PATENT DOCUMENTS 2,765,267 10/1956 Dorst ................................. 204/141.5
3,847,839 11/1974 Murphy ................................ 252/544

*Primary Examiner*—T. M. Tufariello
*Attorney, Agent, or Firm*—Domenica N. S. Hartman

[57] ABSTRACT

This invention comprehends an improved method for uniformly loosening and removing the thin layer of mold flash which deposits on the surface of the metal lead frames during encapsulation of the silicon integrated circuit chips bonded to that metal lead frame surface. The disclosed method does not adversely effect the underlying metal material or the encapsulating plastic material enveloping the silicon integrated circuit chip. The disclosed method is electrolytic and employs (1) the chemical dissolving action of the stripping solution and (2) the percolating effect of the hydrogen gas generated during electrolysis of the water, to loosen the unwanted organic mold flash from the metal lead frame surface. The disclosed electrolytic method for removal of mold flash employs an aqueous based stripping solution preferably comprising;

(a) about 75 grams of sodium hydroxide;
(b) about 50 milliliters of duo-dectal sulfonic acid;
(c) about 100 milliliters of diethylene glycol;
(d) about 40 grams of sodium bicarbonate;
(e) about 100 milliliters of ethoxylated furfuryl alcohol;
(f) about 50 milliliters of tetrahydrofurfuryl alcohol;
(g) about 1.0 milligrams of a nonionic fluorinated alkyl ester surfactant; and
(h) enough deionized water to yield about 1 liter of solution.

14 Claims, No Drawings

ELECTROLYTIC ORGANIC MOLD FLASH REMOVAL

The present invention generally relates to a composition and method for removing unwanted mold flash from metal surfaces. More specifically, this invention relates to an aqueous based stripping solution and electrolytic method for removing excessive injection molded plastic from integrated circuit lead frames after protective encapsulation of the silicon integrated circuit chips on those lead frames.

BACKGROUND OF THE INVENTION

Semiconductor devices are widely used throughout many industries in a variety of applications. A common type of semiconductor device configuration comprises silicon integrated circuit chips bonded onto metal lead frames or metal foils. During the processing and manufacturing of these semiconductor devices, the silicon integrated circuit chips bonded on these metal lead frames or foils must be protected from mechanical, chemical, and environmental degradation.

A common practice is to use an injection molding process to first encapsulate the silicon chips with a plastic material so that the silicon chips will be protected during the subsequent manufacturing operations. However, during the injection molding process, excess plastic may bleed out from under the mold seals and adhere to surfaces other than the region around the silicon chip, such as the surface of the metal lead frame. This is detrimental in that the presence of the excess plastic material adversely affects the subsequent soldering, trimming and forming operations, in addition to the overall electrical characteristics of the device. Therefore, it becomes necessary to remove the excess plastic, particularly on the metal lead frame surface, after encapsulation, or molding, of the silicon chip.

Many chemical and mechanical methods are known for loosening or removing plastics from various surfaces. A common chemical method employed by the semiconductor industry for removing the excess injection molded plastic material, also referred to as mold flash, from the metal lead frame or foil consists of soaking the part for about 30 minutes in a hot organic solvent such as N-Methyl-2-pyrrolidone, water rinsing, and drying. This process loosens the unwanted plastic material from the metal surface. The loosened material is then removed by spraying the parts with high pressure air, water, or an abrasive media compound. It would be advantageous if a composition and method for removal of plastic encapsulation material were provided which would alleviate the number and duration of processing steps now required. It would be particularly advantageous if the provided method for removal could be incorporated into a subsequent manufacturing step, such as a pre-cleaning step prior to the solder plating or coating operations, therefore eliminating the entire series of chemical encapsulation and mechanical removal steps now required.

A significant shortcoming of this and other prior art methods for removal of unwanted mold flash is that these prior methods are incapable of removing the mold flash from all portions of the metal surface. In particular, the current method is unable to consistently or uniformly remove the mold flash which has penetrated the fine cracks or deep, narrow channels on the metal surface of the lead frame. The current composition and method for removal inadequately permeates these regions, and therefore does not contact, or subsequently loosen, the mold flash within these cracks or channels. Incomplete removal of the mold flash from the surface of the metal lead frame is detrimental to the subsequent manufacturing operations, and correspondingly results in high rejection rates of the molded semiconductor devices.

Electrolytic techniques are commonly employed for the removal of material within fine cracks or channels on a surface. However, electrolytic techniques are generally only useful when the material to be removed is conductive, such as a metal. For this reason, prior electrolytic techniques have generally been unavailable for the removal of organic plastic material from metal lead frames or foils, such as the plastic used for encapsulation of the silicon integrated circuit chips. In addition, electrolytic removal methods typically require an anodic workpiece, therefore the part to be stripped becomes anodic and sacrificial. This is a permissible technique where the sacrificial base material is of sufficient thickness so that the loss of sacrificial material is inconsequential. However, this is not a practical or feasible method for removal of plastic encapsulation material from semiconductor lead frames or foils, where thicknesses and dimensions of the materials are relatively thin and critical.

It is therefore desirable to provide a method for removal of mold flash from metal lead frame surfaces after plastic encapsulation of the silicon integrated circuit chips, which is electrolytic, so as to facilitate the loosening and complete removal of mold flash within the deep cracks or channels located on the metal surfaces. It is further desired during the electrolytic removal process, that the metal lead frames or foils which are beig stripped of the organic encapsulating material, are cathodic, so that the underlying metal layers of material are not sacrificially or adversely harmed.

It is also desired, and necessary, that the composition, or stripping solution, employed during the desired electrolytic method be compatible with the plastic material encapsulating the silicon integrated circuit chips, so that the silicon integrated circuit chips remain encapsulated during the removal process and any subsequent manufacturing operations.

SUMMARY OF THE INVENTION

It is an object of the present invention to provide a composition and method, which is electrolytic, for removal of mold flash from metal lead frame surfaces after plastic encapsulation of integrated circuit chips on those metal lead frame surfaces. It is a further object of this invention to provide a composition and electrolytic method for removal which consistently and uniformly removes mold flash from the surface of the metal lead frames, in particular from deep cracks or channels on the metal surface. It is still a further object of this invention that the composition and electrolytic method for removal not adversely affect the underlying metal lead frame or the encapsulating plastic enveloping the silicon integrated circuit chip.

In accordance with a preferred embodiment of this invention, these and other objects and advantages are accomplished as follows.

This invention comprehends an improved method for loosening and removing the thin layer of mold flash which deposits on the surface of the metal lead frames during encapsulation of the silicon integrated circuit chips bonded to that metal lead frame surface. The electrolytic method which is disclosed greatly reduces the number and duration of steps required to remove the mold flash from the metal lead frame surfaces. The disclosed composition and electrolytic method uniformly and consistently loosens and removes the mold flash which has penetrated the fine cracks or channels on the surface of the metal lead frame, yet does not adversely effect the underlying metal material or the encapsulating plastic enveloping the silicon integrated circuit chip.

The disclosed method employs the combination of (1) the chemical dissolving action of the stripping solution and (2) the percolating effect of the hydrogen gas generated during, it is believed, electrolysis of the water, to loosen and dissolve the unwanted organic mold flash or resin bleed from the metal lead frame surface. The parts to be stripped, i.e., the metal lead frames or foils, are maintained between two metal surfaces and immersed in a hot stripping solution of a preferred composition, also disclosed in this application. The parts to be stripped are made cathodic, therefore the metal lead frames or foils do not provide the sacrificial material. A DC electrical current, preferably about 6 volts and 200–400 amperes per square foot, is applied to the parts through the stripping solution for about one minute. Due to the applied direct current which is of sufficient strength to produce hydrogen generation, electrolysis of the water occurs and hydrogen gas bubbles are generated at the cathodic metal surfaces, i.e., the metal lead frames and foils. The generated hydrogen gas bubbles collect at the interface between the organic mold flash and the underlying metal lead frame surface.

The generation of hydrogen gas bubbles during the electrolysis of the water provides a dual-action benefit to the removal of the organic mold flash. The percolating or bubbling action forces the gas bubbles between the mold flash and metal surface therefore helping to loosen the bonds between the plastic and the metal. However, the percolating or bubbling action also creates a localized stirring effect where the bubbles are generated, therefore increasing the amount of mold flash resin exposed to the stripping composition, greatly improving the effectiveness of the removal action of the composition and method. Further, because this method for removal is electrolytic, hydrogen gas generation occurs at the fine cracks and channels within the metal surface also, therefore providing uniform removal of the mold flash from, the metal surface. This method for removal of mold flash significantly reduces the time required for removal. Mold flash is removed from the metal surfaces using this method in less than a minute.

The disclosed electrolytic method for removal of mold flash employs an aqueous based stripping solution. In addition, the metal lead frames or foils are cathodic, i.e., not anodically sacrificial. Therefore this method does not adversely affect the underlying metal. The chemical composition of the stripping solution is compatible with the silicon integrated circuit chips and the protective injection molded plastic encapsulation material enveloping the integrated circuit chips.

A preferred chemical composition for the stripping solution to be used with the disclosed electrolytic removal method comprises:

(a) about 75 grams of an alkaline hydroxide, such as sodium or potassium hydroxide;
(b) about 50 milliliters of duo-dectal sulfonic acid;
(c) about 100 milliliters of diethylene glycol;
(d) about 40 grams of sodium bicarbonate;
(e) about 100 milliliters of ethoxylated furfuryl alcohol;
(f) about 50 milliliters of tetrahydrofurfuryl alcohol;
(g) about 1.0 milligrams of a non-ionic fluoaliphatic alkyl polymeric ester; and
(h) enough deionized water to yield about 1 liter of solution.

The disclosed chemical composition permits electrolytic removal of excess mold flash material from metal surfaces in an expeditious and practical manner. The solution dissolves the plastic encapsulating material enveloping the integrated circuit chip, however, at an insignificant rate since electrolysis and subsequent hydrogen gas generation, do not occur at the silicon chip surface. Therefore, the amount of encapsulating material dissolved from around the chip is negligible. The solution is non-corrosive and compatible with all materials used. The solution is water soluble, biodegradable, and prevents excessive discoloration of the underlying copper metal lead frames.

Other objects and advantages of this invention will be better appreciated from he following detailed description.

DETAILED DESCRIPTION OF THE INVENTION

An electrolytic method is disclosed for removal of the excess plastic injection molding material, or mold flash, from the surface of a metal lead frame after plastic encapsulation of the silicon integrated circuits on those metal lead frames. This method for removal may be used with any of the standard copper or nickel-iron lead frames or foils used throughout the semiconductor industry, although other suitable materials may also be used.

The preferred method for removal of mold flash loosens and removes the thin layer of mold flash which deposits on the surface of the metal lead frames during encapsulation of the silicon integrated circuit chips bonded to that metal lead frame surface. The disclosed composition and electrolytic method uniformly and consistently loosens and dissolves the mold flash which has penetrated the fine cracks or channels on the surface of the metal lead frame, yet does not adversely effect the underlying metal material or the encapsulating plastic enveloping the silicon integrated circuit chip.

The disclosed method employs the combination of (1) the chemical dissolving action of the stripping solution and (2) the percolating effect of the hydrogen gas generated during electrolysis of the water, to loosen the unwanted organic mold flash from the copper lead frame surface. During the removal process, the copper foils, each having a plurality of silicon integrated circuit chips, are cathodic and a DC electrical current is applied to the copper foils through the stripping solution. Electrolysis of the water occurs due to the applied direct current, therefore hydrogen gas bubbles are generated at the cathodic metal surfaces, i.e., the metal lead frames and foils, and collect at the interface between the organic mold flash and the underlying metal lead frame surface.

The generation of hydrogen gas bubbles during the electrolysis of the water provides a dual-action advantageous effect on the removal of the organic mold flash. The percolating or bubbling action forces the gas bubbles between the mold flash and metal surface therefore helping to loosen the bonds between the plastic and the metal. In addition, the percolating or bubbling action also creates a localized stirring effect where the bubbles are generated, therefore increasing the amount of mold flash exposed to the stripping composition. This localized stirring action greatly facilitates and improves the effectiveness of the dissolving action of the stripping composition. Therefore, the loosened mold flash from the metal surface is dissolved quite rapidly. Yet, the thicker encapsulating plastic material enveloping the silicon integrated circuit chips is dissolved only at the non-electrolytic rate, which is relatively slow. Therefore the amount of encapsulating material dissolved from around the silicon chip is insignificant since hydrogen generation is negligible at the silicon chip.

Further, because this method for removal is electrolytic, hydrogen gas generation occurs at all of the cathodic surfaces, including the fine cracks and channels within the metal surface. Therefore uniform removal of the mold flash throughout all regions of the metal surface is provided. This method for removal of mold flash significantly reduces the time required for removal. Mold flash is removed from the metal surfaces using this method in less than a minute.

The disclosed electrolytic method for removal of mold flash employs an aqueous based stripping solution. In addition, the metal lead frames or foils are cathodic. Therefore this method does not adversely affect the underlying metal. The chemical composition of the stripping solution is compatible with the silicon integrated circuit chips and the protective injection molded plastic encapsulation material.

In the preferred embodiment of this invention, a strip of copper foil, about 0.0028 inches thick by about 0.75 inches wide by about 8 inches long, is provided having a plurality of silicon integrated circuit chips bonded continuously along the length of the foil. Suitable results have been obtained with foil thicknesses ranging between about 0.0007–0.015 inches, also. The silicon integrated circuit chips bonded to the metal lead frames are encapsulated with a protective plastic material, such as the standard thermoset plastics or standard thermoplastics, using an injection molding process. This injection molding process used to encapsulate the silicon chips does not form a part of the claimed inventive subject matter of this patent application.

Individual lead frame assemblies comprising a plurality of silicon integrated circuit chips were individually secured to a metal rack using copper hooks, so as to hang from the metal rack. The metal rack and lead frame assemblies were immersed in a bath containing the heated stripping solution. The chemical composition of the stripping solution comprises:
 (a) about 25–150 grams of an alkali metal hydroxide;
 (b) about 15–100 milliliters of a detergent, such as sulfonic acid;
 (c) about 30–200 milliliters of a glycol compound;
 (d) about 15–100 grams of an alkali metal bicarbonate;
 (e) about 25–200 milliliters of ethoxylated furfuryl alcohol;
 (f) about 15–1000 milliliters of tetrahydrofurfuryl alcohol;
 (g) about 50–300 parts per million fluorinated surfactant; and
 (h) enough deionized water to yield about 0.75 to about 3.0 liters of solution.

The preferred chemical composition for the stripping solution consists of:
 (a) about 75 grams of an alkaline metal hydroxide, such as sodium or potassium hydroxide;
 (b) about 50 milliliters of duo-dectal sulfonic acid;
 (c) about 100 milliliters of diethylene glycol, such as 2-2' oxydiethanol;
 (d) about 40 grams of sodium bicarbonate;
 (e) about 100 milliliters of ethoxylated furfuryl alcohol;
 (f) about 50 milliliters of tetrahydrofurfuryl alcohol;
 (g) about 1.0 milligrams of a nonionic fluorinated alkyl ester surfactant, such as a nonionic fluoalophatic alkyl polymeric ester; and
 (h) enough deionized water to yield about 1 liter of solution.

Although the preferred composition of this stripping solution contains enough deionized water to yield about 1 liter of stripping solution, suitable results have been obtained over a wide range of dilutions. The solution has been diluted with deionized water between a range of 0.75 liters to about three liters without any significant decrease in the effectiveness of the stripping action of the solution. The stripping solution is heated to preferably about 150° F., although the temperature may vary between about 70°–180° F. without detrimental effects, prior to immersing the foil assemblies in the removal bath, and is maintained at that temperature during the duration of the immersion.

The metal rack having the foil assemblies is immersed within the bath so that the copper foil assemblies are cathodic and electrically connected through the copper hooks to exterior stainless steel anodes. An electrical current is applied to the copper foil assemblies, preferably 200–400 amps per square foot at about 6 volts and 3 amps per 6 pieces. The voltage may vary between about 3–10 volts, with a minimum of 3 volts being required in order to generate the hydrogen overvoltage required. The duration of the applied current is inversely related to the temperature of the stripping solution, so that at about 150° F. An exposure of only about 15 seconds is required to remove the mold flash. The foil lead assemblies are then removed from the stripping solution and rinsed in water.

Although our invention discloses a preferred embodiment suitable for removal of organic encapsulating material from metal lead frame assemblies, it is to be understood that various modifications and changes can be made in construction and use without departing from the spirit of the invention.

The embodiments of the invention in which an exclusive property of privilege is claimed are defined as follows:

1. An electrolytic method for removing organic plastic material from a metal surface comprising the steps of:
 (A) immersing the metal surface in a solution comprising:
  (a) about 25–150 grams of an alkali metal hydroxide;
  (b) about 15–100 milliliters of a detergent;
  (c) about 30–200 milliliters of a glycol compound;
  (d) about 15–100 grams of an alkali metal bicarbonate;
  (e) about 25–200 milliliters of ethoxylated furfuryl alcohol;
  (f) about 15–1000 milliliters of tetrahydrofurfuryl alcohol;
  (g) about 50–300 parts per million fluorinated surfactant; and (h) a sufficient amount of deionized water to yield about 0.75 to about 3.0 liters of solution, said amount being at least enough to create hydrogen generation within said solution when an appropriate voltage is applied to said solution;

(B) applying a voltage to said metal surface so that said metal surface is made cathodic, said voltage being sufficient to create hydrogen generation within said solution; and (C) for a duration sufficient to remove the organic plastic material from said metal surface.

2. An electrolytic method for removing organic material from a metal surface after plastic encapsulation of an integrated circuit on that metal surface as recited in claim 1 wherein said voltage is applied for a duration of at least about 5 seconds.

3. An electrolytic method for removing organic material from a metal surface after plastic encapsulation of an integrated circuit on that metal surface as recited in claim 1 wherein said voltage is applied for a duration of about 15 seconds and said stripping solution is heated to about 150° F.

4. An electrolytic method for removing organic material from a metal surface after plastic encapsulation of an integrated circuit on that metal surface as recited in claim 1 wherein said solution is heated to a temperature greater than about 70° F.

5. An electrolytic method for removing organic material from a metal surface after plastic encapsulation of an integrated circuit on that metal surface as recited in claim 1 wherein said organic material being removed is a thermoset plastic.

6. An electrolytic method for removing organic material from a metal surface after plastic encapsulation of an integrated circuit on that metal surface as recited in claim 1 wherein said organic material being removed is a thermoplastic.

7. An electrolytic method for removing organic plastic material from a metal surface comprising the steps of:
(A) immersing the metal surface in a solution comprising:
  (a) about 75 grams of an alkali metal hydroxide;
  (b) about 50 milliliters of duo-dectal sulfonic acid;
  (c) about 100 milliliters of diethylene glycol;
  (d) about 40 grams of sodium bicarbonate;
  (e) about 100 milliliters of ethoxylated furfuryl alcohol;
  (f) about 50 milliliters of tetrahydorfurfuryl alcohol;
  (g) about 1.0 milligrams of a nonionic fluorinated alkyl ester surfactant; and
  (h) sufficient deionized water to yield 0.75 liters of said solution;
(B) applying a voltage to said metal surface so that said metal surface is made cathodic, said voltage being sufficient to create hydrogen generation within said solution; and
(C) for a duration sufficient to remove the organic plastic material from said metal surface.

8. An electrolytic method for removing organic material from a metal surface as recited in claim 7 wherein said alkali metal is selected from the group consisting of sodium or potassium.

9. An electrolytic method for removing organic plastic material form a copper surface after plastic encapsulation of an integrated circuit on that copper surface comprising the steps of:
(A) immersing the copper surface having at least one silicon integrated circuit disposed thereon in a solution comprising:
  (a) about 25-150 grams of an alkali metal hydroxide;
  (b) about 15-100 milliliters of a detergent;
  (c) about 30-200 milliliter of a glycol compound;
  (d) about 15-100 grams of an alkali metal bicarbonate;
  (e) about 25-200 milliliters of ethoxylated furfuryl alcohol;
  (f) about 15-1000 milliliters of tetrahydrofurfuryl alcohol;
  (g) about 50-300 parts per million fluorinated surfactant; and
  (h) a sufficient amount of deionized water to yield about 0.75 to about 3.0 liters of solution, said amount being at least enough to create hydrogen generation within said solution when an appropriate voltage is applied to said solution;
(B) applying a voltage to said metal surface so that said metal surface is made cathodic, said voltage being sufficient to create hydrogen generation within said solution; and
(C) for a duration sufficient to remove the organic plastic material from said metal surface.

10. An electrolytic method for removing organic plastic material from a copper surface after plastic encapsulation of an integrated circuit on that copper surface comprising the steps of:
(A) immersing the copper surface having at least one silicon integrated circuit disposed thereon in a solution comprising:
  (a) about 75 grams of sodium hydroxide;
  (b) about 50 milliliters of duo-dectal sulfonic acid;
  (c) about 100 milliliters of diethylene glycol;
  (d) about 40 grams of sodium bicarbonate;
  (e) about 100 milliliters of ehtoxylated furfuryl alcohol;
  (f) about 50 milliliters of tetrahydorfurfuryl alcohol;
  (g) about 1.0 milligrams of a nonionic fluorinated alkyl ester surfactant; and
  (h) a sufficient amount of deionized water to yield about 1 liter of said solution;
(B) heating said solution to about 150° F.;
(C) applying a voltage to said metal surface so that said metal surface is made cathodic, said voltage being sufficient ot create hydrogen generation within said solution; and
(D) for about 15 seconds, a duration sufficient to remove the organic encapsulating material from siad metal surface.

11. A chemical composition for removing organic plastic material from a metal surface after plastic encapsulation of an integrated circuit on the metal surface comprising:
(a) about 25-150 grams of an alkali metal hydroxide;
(b) about 15-100 milliliters of a detergent;
(c) about 30-200 milliliters of a glycol compound;
(d) about 15-100 grams of an alkali metal bicarbonate;
(e) about 25-200 milliliters of ethoxylated furfuryl alcohol;
(f) about 15-1000 milliliters of tetrahydorfurfuryl alcohol;
(g) about 50-300 parts per million fluorinated surfactant; and (h) a sufficient amount of deionized water to yield about 0.75 to about 3.0 liters of solution, said amount being at least enough to create hydrogen genreation within said solution when an appropriate voltage is applied to said solution.

12. A chemical composition for removing organic material from a metal surface after plastic encapsulation of an integrated circuit on the metal surface comprising:
 (a) about 75 grams of sodium hydroxide;
 (b) about 50 milliliters of duo-dectal sulfonic acid;
 (c) about 100 milliliters of diethylene glycol;
 (d) about 40 grams of sodium bicarbonate;
 (e) about 100 milliliters of ethoxylated furfuryl alcohol;
 (f) about 50 milliliters of tetrahydrofurfuryl alcohol;
 (g) about 1.0 milligram of a nonionic fluorinated alkyl ester surfactant; and
 (h) sufficient deionized water to yield at least 0.75 liters of said solution.

13. A chemical composition as recited in claim 12 wherein said deionized water is an amount sufficient to yield not greater than about 3 liters of said chemical composition.

14. An electrolytic method for removing organic plastic material from a copper surface after plastic encapsulation of an integrated circuit on that copper surface as recited in claim 10 wherein the applied voltage to said metal surface produces a current density of about 200 about 400 amps per square foot.

* * * * *